(12) United States Patent
Lu

(10) Patent No.: US 10,269,974 B2
(45) Date of Patent: Apr. 23, 2019

(54) METHOD OF MANUFACTURING LOWER TEMPERATURE POLYCRYSTAL SILICON THIN FILM TRANSISTOR ARRAY SUBSTRATE

(71) Applicant: Shenzhen China Star Optoelectronics Technology Co., Ltd., Guangdong (CN)

(72) Inventor: Macai Lu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 628 days.

(21) Appl. No.: 14/888,645

(22) PCT Filed: Apr. 30, 2015

(86) PCT No.: PCT/CN2015/077964
§ 371 (c)(1),
(2) Date: Nov. 2, 2015

(87) PCT Pub. No.: WO2016/145726
PCT Pub. Date: Sep. 22, 2016

(65) Prior Publication Data
US 2018/0122957 A1    May 3, 2018

(30) Foreign Application Priority Data
Mar. 16, 2015 (CN) .................. 2015 1 0114652

(51) Int. Cl.
*H01L 27/12* (2006.01)
*G02F 1/1335* (2006.01)
(Continued)

(52) U.S. Cl.
CPC .. *H01L 29/78675* (2013.01); *H01L 21/02592* (2013.01); *H01L 21/02675* (2013.01);
(Continued)

(58) Field of Classification Search
CPC ......... H01L 29/78621; H01L 29/66757; H01L 27/1288; H01L 27/1214; H01L 27/124; H01L 27/1259
See application file for complete search history.

(56) References Cited

U.S. PATENT DOCUMENTS 6,518,594 B1 * 2/2003 Nakajima ............ G02B 27/017
257/347
6,677,189 B2 * 1/2004 Dai .................... H01L 29/66757
257/E21.413
(Continued)

FOREIGN PATENT DOCUMENTS

| CN | 1632857 | 6/2005 |
|---|---|---|
| CN | 101752319 | 6/2010 |

(Continued)

OTHER PUBLICATIONS

International Search Report for PCT/CN2015/077964, English translation attached to original, Both completed by the Chinese Patent Office dated Nov. 15, 2015, All together 6 Pages.

*Primary Examiner* — Bradley Smith
*Assistant Examiner* — David J Goodwin
(74) *Attorney, Agent, or Firm* — Mintz Levin Cohn Ferris Glovsky and Popeo, P.C.; Kongsik Kim; Jhongwoo Jay Peck

(57) ABSTRACT

The present invention discloses a method of manufacturing array substrate, comprising: A) defining a heavily doped region and a lightly doped region of a source electrode of an N-channel area, and a heavily doped region and a lightly doped region of a drain electrode of the N-channel area by using a first photomask having a first pattern; B) defining a doped region of a source electrode of a P-channel area and a doped region of a drain electrode of the P-channel area by using a second photomask having a second pattern; C) defining a pixel region, a contact hole region by using a third (Continued)

photomask having a third pattern; and D) defining a metal electrode region by using a fourth photomask having a fourth pattern.

11 Claims, 7 Drawing Sheets

(51) Int. Cl.
  *H01L 29/786* (2006.01)
  *H01L 21/02* (2006.01)
  *H01L 29/66* (2006.01)
(52) U.S. Cl.
  CPC ........ *H01L 27/127* (2013.01); *H01L 27/1218* (2013.01); *H01L 27/1229* (2013.01); *H01L 27/1251* (2013.01); *H01L 27/1288* (2013.01); *H01L 29/66757* (2013.01); *H01L 29/66765* (2013.01); *H01L 29/78621* (2013.01); *H01L 29/78669* (2013.01)

(56) References Cited

U.S. PATENT DOCUMENTS

| | | | |
|---|---|---|---|
| 8,575,611 | B2 | 11/2013 | Segawa |
| 9,425,223 | B1 | 8/2016 | Wang |
| 9,508,757 | B2 | 11/2016 | Li et al. |
| 9,564,413 | B2 * | 2/2017 | Han ............... H01L 31/02005 |
| 2002/0001886 | A1 * | 1/2002 | Ohtani ............... G02B 27/017 |
| | | | 438/151 |
| 2004/0229415 | A1 * | 11/2004 | Takehashi ......... H01L 29/66757 |
| | | | 438/163 |
| 2006/0205126 | A1 * | 9/2006 | Yen ............... H01L 27/1214 |
| | | | 438/163 |
| 2009/0061548 | A1 * | 3/2009 | Cheng ............... H01L 27/1214 |
| | | | 438/22 |
| 2011/0204494 | A1 * | 8/2011 | Chi ............... H01L 21/56 |
| | | | 257/659 |
| 2013/0249106 | A1 * | 9/2013 | Lin ............... H01L 24/19 |
| | | | 257/774 |
| 2016/0254368 | A1 * | 9/2016 | Jiang ............... H01L 21/28088 |
| | | | 257/72 |
| 2018/0067351 | A1 * | 3/2018 | Deng ............... G02F 1/1362 |
| 2018/0069034 | A1 * | 3/2018 | He ............... H01L 27/1288 |

FOREIGN PATENT DOCUMENTS

| | | | | |
|---|---|---|---|---|
| CN | 103456739 | | 12/2013 | |
| CN | 103996716 B | * | 4/2014 | ............ H01L 27/12 |
| CN | 104157608 | | 11/2014 | |
| WO | 2011161910 | | 12/2011 | |

* cited by examiner

METHOD OF MANUFACTURING LOWER TEMPERATURE POLYCRYSTAL SILICON THIN FILM TRANSISTOR ARRAY SUBSTRATE

CROSS-REFERENCE TO RELATED APPLICATION

This application is the U.S. national phase of PCT Application No. PCT/CN2015/077964 filed on Apr. 30, 2015, which claims priority to CN Patent Application No. 201510114652.2 filed on Mar. 16, 2015, the disclosures of which are incorporated in their entirety by reference herein.

TECHNICAL FIELD

The present invention relates to the technical field of liquid crystal display, and more specifically, to a method of manufacturing lower temperature polycrystal silicon (LTPS) thin film transistor (TFT) array substrate.

BACKGROUND

With the evolution of photovoltaic and semiconductor technology, the flat panel display is also developing fast. Among various types of flat panel displays, the liquid crystal display (LCD) has become a spotlight in the market due to the superior characteristics, such as higher space utilization, lower power consumption, zero radiation, and lower electromagnetic interference, and so on.

Currently, a-Si TFTs are widely used as the switch element of LCDs. However, the a-Si TFT LCD is still limited in terms of the various demands (such as thinner body, smaller weight, higher fineness, higher brightness, higher reliability, and lower power consumption, and so on). To satisfy the above demand, the lower temperature polycrystal silicon (LTPS) TFT LCD is apparently advantageous compared with the a-Si TFT LCD. However, current manufacturing process of the LTPS TFT is relatively complex, and at least eight masks are required to form the LTPS TFT.

The processes for forming the LTPS TFT array substrate with either maksts in the prior art sequentially include: p-Si patterning, specifically referring to forming a polycrystal silicon pattern after a p-Si dry etch; shielding a P-type area, and conducting ion implantation on a N-type area (source/drain); performing gate deposition, forming a first metal layer, and defining a gate; shielding the N-type area, and conducting ion implantation on the P-type area; forming contact holes; depositing a wiring layer, forming a second metal layer, and defining data line pattern; depositing a flat layer, and forming contact holes; defining the shape of a pixel electrode. The processes of forming the LTPS TFT array substrate in the prior art are very complex, which is disadvantageous in lowering the cost.

SUMMARY

In order to solve the problems existing in the prior art, the present invention aims to provide a method of manufacturing a lower temperature polycrystal silicon thin film transistor array substrate, including the steps of: A) defining a heavily doped region of a source electrode of an N-channel area, a lightly doped region of the source electrode of the N-channel area, a heavily doped region of a drain electrode of the N-channel area and a lightly doped region of the drain electrode of the N-channel area by using a first photomask having a first pattern; B) defining a doped region of a source electrode of a P-channel area and a doped region of a drain electrode of the P-channel area by using a second photomask having a second pattern; C) defining a pixel region, a contact hole region at the heavily doped region of the drain electrode of the N-channel area, a contact hole region at the heavily doped region of the source electrode of the N-channel area, a contact hole region at the heavily doped region of the drain electrode of the P-channel area, and a contact hole region at the heavily doped region of the source electrode of the P-channel area by using a third photomask having a third pattern; and D) defining a metal electrode region at the heavily doped region of the drain electrode of the N-channel area, a metal electrode region at the heavily doped region of the source electrode of the N-channel area, a metal electrode region at the heavily doped region of the drain electrode of the P-channel area, and a metal electrode region at the heavily doped region of the source electrode of the P-channel area by using a fourth photomask having a fourth pattern.

Furthermore, the first stripped photomask is a first photomask which comprises one or more stripes. For example, the first stripped photomask is a greyscale photomask or a halftone photomask.

Furthermore, the second stripped photomask is a second photomask which comprises one or more stripes. For example, the second stripped photomask is a greyscale photomask or a halftone photomask.

Furthermore, the third stripped photomask is a third photomask which comprises one or more stripes. For example, the third stripped photomask is a greyscale photomask or a halftone photomask.

Furthermore, the fourth stripped photomask is a fourth photomask which comprises one or more stripes. For example, the fourth stripped photomask is a greyscale photomask or a halftone photomask.

Furthermore, step A) further includes: forming in sequence a buffer layer, a polycrystal silicon layer, a first insulating layer and a first metal layer on the substrate; coating a layer of photoresist on the first metal layer; exposing and developing the photoresist by using the first photomask, so as to remove the photoresist above the heavily doped region of the source electrode of the N-channel area and above the heavily doped region of the drain electrode of the N-channel area, and to remove part of the photoresist above the lightly doped region of the source electrode and above the lightly doped region of the drain electrode; etch removing the first metal layer above the heavily doped region of the source electrode of the N-channel area and above the heavily doped region of the drain electrode of the N-channel area; performing ion implantation on the heavily doped region of the source electrode of the N-channel area and the heavily doped region of the drain electrode of the N-channel area; removing the remaining photoresist above the lightly doped region of the source electrode of the N-channel area and above the lightly doped region of the drain electrode of the N-channel area; etch removing the first metal layer above the lightly doped region of the source electrode and the lightly doped region of the drain electrode; performing ion implantation again on the heavily doped region and lightly doped region of the source electrode of the N-channel area as well as the heavily doped region and lightly doped region of the drain electrode of the N-channel area; and removing all the remaining photoresist.

Furthermore, said step B) further includes: coating a photoresist on the substrate after performing said step A); exposing and developing the photoresist by using the second photomask, so as to remove the photoresist between the N-channel area and the P-channel area, and to remove part of the photoresist above the doped region of the source electrode of the P-channel area and above the doped region of the drain electrode of the P-channel area; removing the polycrystal silicon layer, the first insulating layer and the first metal layer between the N-channel area and the P-channel area; removing the remaining photoresist above the doped region of the source electrode of the P-channel area and above the doped region of the drain electrode of the P-channel area; etch removing the first metal layer above the doped region of the source electrode of the P-channel area and above the doped region of the drain electrode of the P-channel area; performing ion implantation on the doped region of the source electrode of the P-channel area and the doped region of the drain electrode of the P-channel area; and removing all the remaining photoresist.

Furthermore, said step C) further includes: forming a second insulating layer, a transparent conductive layer and a photoresist on the substrate after finishing step B); exposing and developing the photoresist by using the third photomask, so as to remove the photoresist above the heavily doped region of the drain electrode of the N-channel area and above the heavily doped region of the source electrode of the N-channel area, and to remove the photoresist above the doped region of the source electrode of the P-channel area and above the doped region of the drain electrode of the P-channel area; removing the first insulating layer, the transparent conductive layer and the second insulating layer above the heavily doped region of the drain electrode of the N-channel area and above the heavily doped region of the source electrode of the N-channel area, as well as above the doped region of the source electrode of the P-channel area and above the doped region of the drain electrode of the P-channel area, so as to form the contact hole; removing all the other photoresist than the photoresist in the pixel region, so as expose all the other transparent conductive layer than the transparent conductive layer in said pixel region; and removing the exposed transparent conductive layer.

Furthermore, said step D) further includes: forming a second metal layer on the substrate after finishing step C); coating a photoresist on the second metal layer; exposing and developing the photoresist by using the fourth photomask, so as to remove all the other photoresist than the photoresist above the heavily doped region of the drain electrode of the N-channel area and above the heavily doped region of the source electrode of the N-channel area, and the photoresist above the doped region of the source electrode of the P-channel area and above the doped region of the drain electrode of the P-channel area; etch removing the exposed second metal layer; removing the photoresist above the heavily doped region of the drain electrode of the N-channel area and the photoresist above doped region of the source electrode of the P-channel area; removing part of the photoresist above the heavily doped region of the source electrode of the N-channel area and removing part of the photoresist above the doped region of the drain electrode of the P-channel area; forming the passivation layer through deposition; and removing part of the photoresist above the heavily doped region of the source electrode of the N-channel area and removing part of the photoresist and the passivation layer above the doped region of the drain electrode of the P-channel area.

Compared with the manufacturing method in the prior art, the manufacturing method the present invention only adopts four photomasks to achieve the manufacturing of the lower temperature polycrystal silicon thin film transistor array substrate, which may significantly reduce the number of photomasks to be used, thereby reducing the production cost while improving the production efficiency.

BRIEF DESCRIPTION OF THE DRAWINGS

These and/or other aspects, characteristics and advantages of the embodiments in the invention will become apparent and more readily appreciated from the following description, taken in conjunction with the accompanying drawings in which:

FIG. 2-1 to FIG. 2-25 are structural diagrams for manufacturing the lower temperature polycrystal silicon thin film transistor array substrate according to the embodiment of the present invention.

DETAILED DESCRIPTION OF EXEMPLARY EMBODIMENTS

Figure 1:
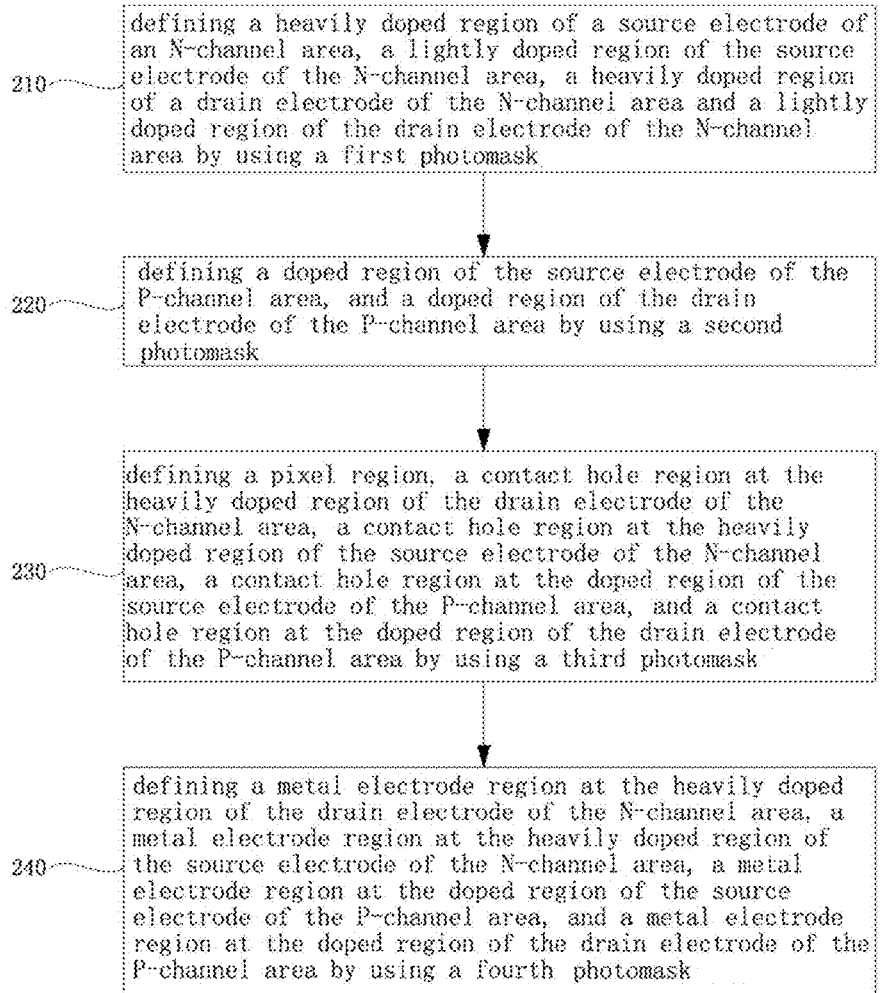
FIG. 1 is a flowchart of a method of manufacturing a lower temperature polycrystal silicon thin film transistor array substrate according to an embodiment of the present invention.

Embodiments of the present invention will be described in detail below by referring to the accompany drawings. However, the present invention may be implemented in various different forms, and the present invention may not be explained to be limited hereto. Instead, these embodiments are provided for explaining the principle and actual application of the present invention, thus other skilled in the art may understand various embodiments and amendments which are suitable for specific intended applications of the present invention. In the drawings, like reference signs always indicate like components.

In the method of manufacturing lower temperature polycrystalline silicon (LTPS) thin film transistor (TFT) array substrate of the present invention, the LTPS TFT array substrate at least includes an N-channel area and a P-channel area, while the present invention is not limited thereto.

FIG. 1 is a flowchart of a method of manufacturing a lower temperature polycrystal silicon thin film transistor array substrate according to an embodiment of the present invention. FIG. 2-1 to FIG. 2-25 are structural diagrams for manufacturing a lower temperature polycrystal silicon thin film transistor array substrate according to an embodiment of the present invention.

Referring to FIG. 1 and FIG. 2-1 to FIG. 2-25, in step 210, defining a heavily doped region 316a of a source electrode of an N-channel area, a lightly doped region 316b of the source electrode of the N-channel area, a heavily doped region 317a of a drain electrode of the N-channel area and a lightly doped region 317b of the drain electrode of the N-channel area by using a first photomask having a first pattern (for example, the gray tone mask (GTM) photomask or the half tone mask (HTM) mask).

Furthermore, step 210 particularly includes the following steps.

Figures 1, 2:
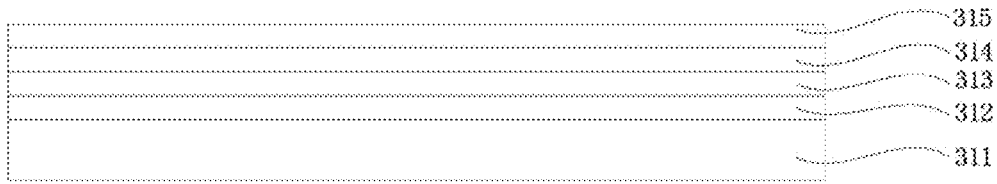
Figure 2:
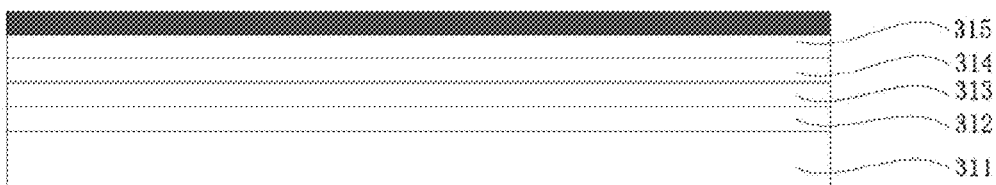

First, as shown in FIG. 2-1, forming in sequence a buffer layer 312, a polycrystal silicon (p-Si) layer 313, a first insulating layer 314 and a first metal layer 315 on the substrate 311; here, the substrate 311 may be, for example, an insulating glass substrate or quartz substrate; the buffer layer 312 may be, for example, a SiNx/SiOx structure formed on the substrate 311 through a PECVD process; the forming of the polycrystal silicon layer 313 may be, for example, forming an amorphous silicon (a-Si) layer on the surface of the buffer layer 312 by means of sputtering, and recrystallizing the amorphous silicon layer by means of annealing; the first insulating layer 314 may be, for example, a SiNx/SiOx structure formed on the substrate 311 through a PECVD process; as the gate electrode metal layer, the first metal layer 315 may be, for example, the MoAlMo structure or the TiAlTi structure.

Next, as shown in FIG. 2-2, coating a layer of photoresist (indicated by a gray block in the drawing) on the first metal layer 315.

Figures 2, 3:
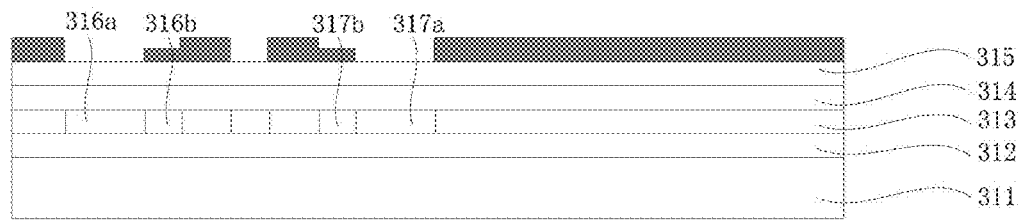

Next, as shown in FIG. 2-3, exposing and developing the photoresist by using the first photomask, so as to remove the photoresist above the heavily doped region 316*a* of the source electrode of the N-channel area and above the heavily doped region 317*a* of the drain electrode of the N-channel area, and to remove part of the photoresist above the lightly doped region 316*b* of the source electrode and above the lightly doped region 317*b* of the drain electrode, thereby defining the heavily doped region 316*a* and the lightly doped region 316*b* of the source electrode of the N-channel area as well as the heavily doped region 317*a* and the lightly doped region 317*b* of the drain electrode of the N-channel area.

Figures 2, 3, 4:
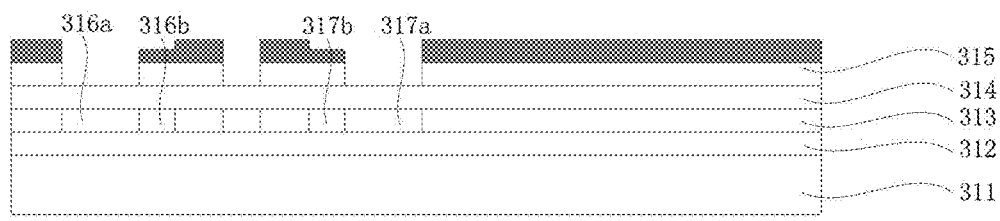
Figures 2, 3, 4, 5:
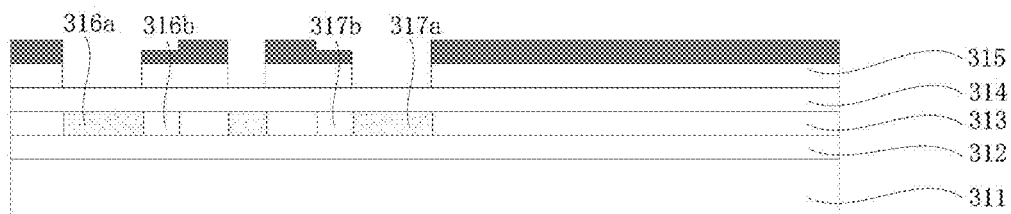
Figures 2, 3, 4, 5, 6:
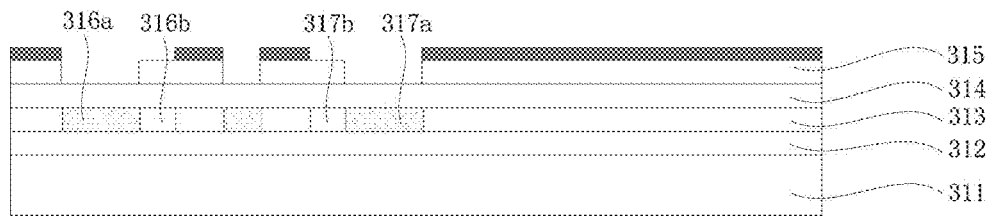
Figures 2, 3, 4, 5, 6, 7:
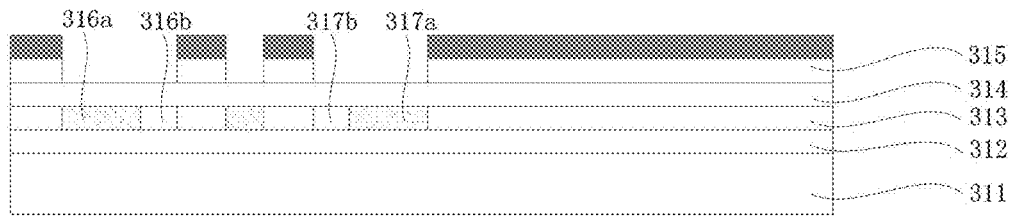
Figures 2, 3, 4, 5, 6, 7, 8:
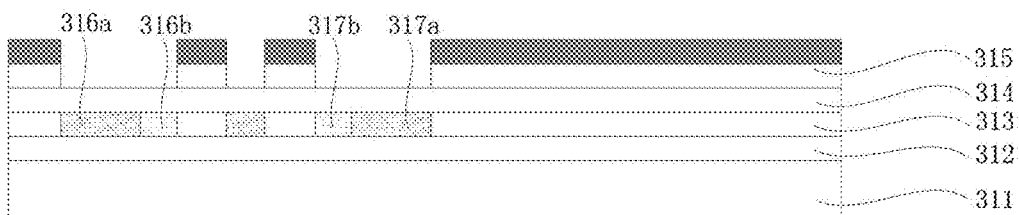
Figures 2, 3, 4, 5, 6, 7, 8, 9:
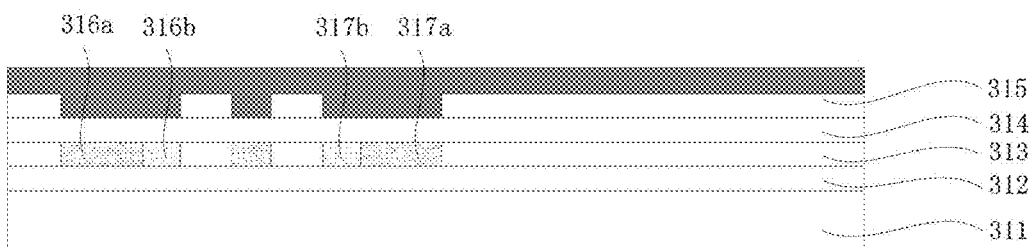
Figures 2, 3, 4, 5, 6, 7, 8, 9, 10:
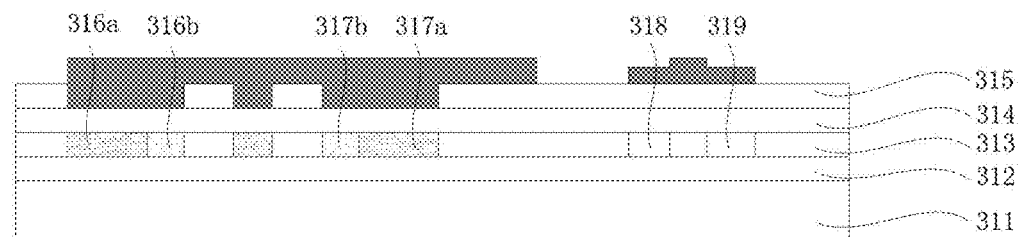
Figures 2, 3, 4, 5, 6, 7, 8, 9, 10, 11:
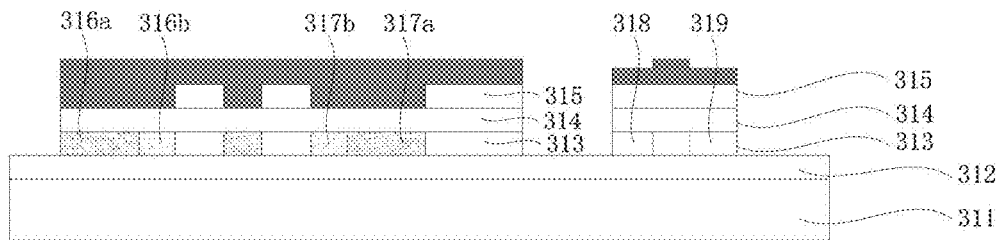
Figures 2, 3, 4, 5, 6, 7, 8, 9, 10, 11, 12:
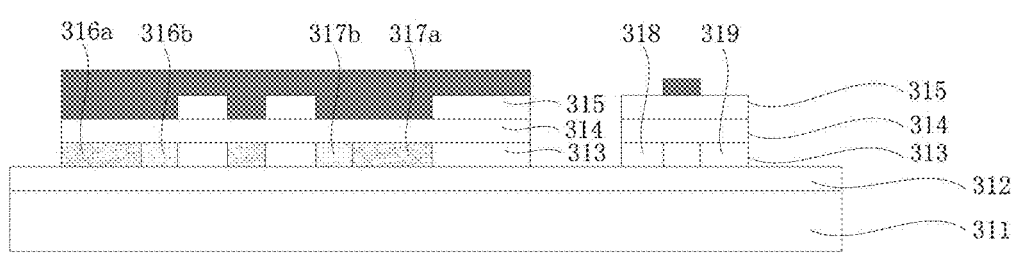
Figures 2, 3, 4, 5, 6, 7, 8, 9, 10, 11, 12, 13:
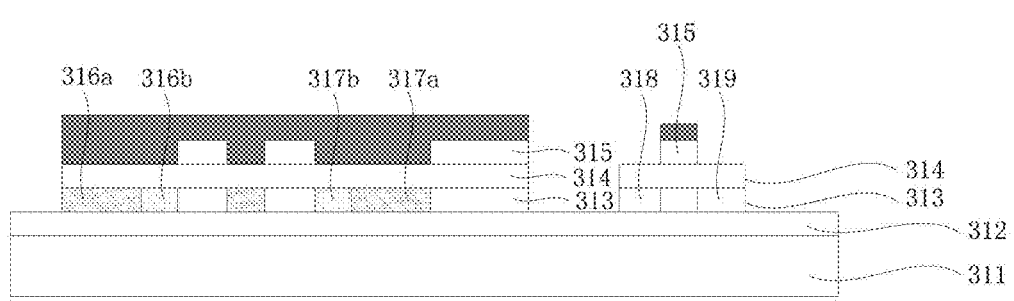
Figures 2, 3, 4, 5, 6, 7, 8, 9, 10, 11, 12, 13, 14:
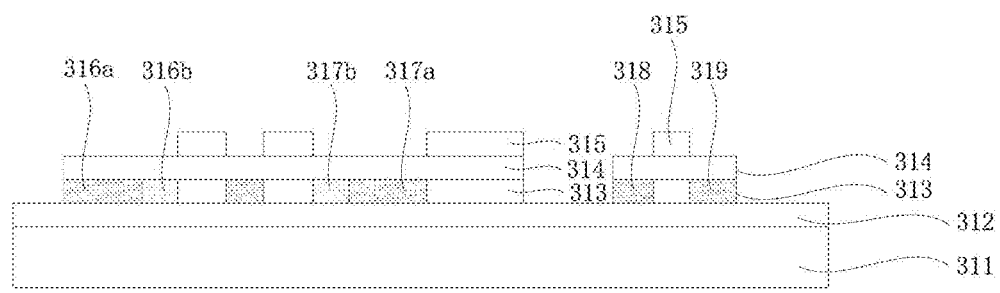
Figures 2, 3, 4, 5, 6, 7, 8, 9, 10, 11, 12, 13, 14, 15:
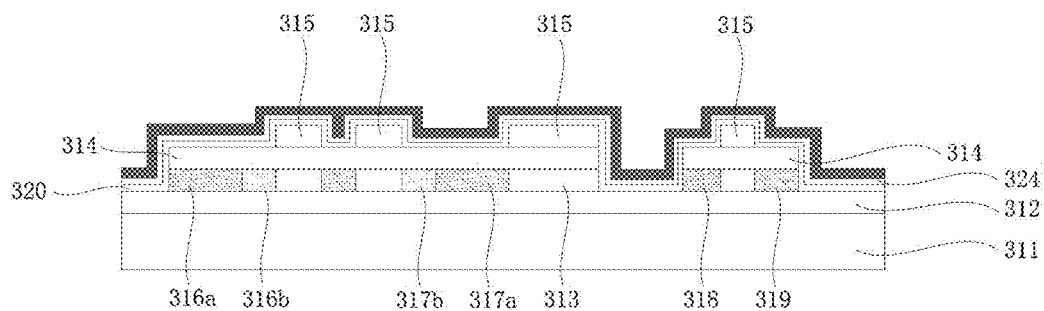
Figures 2, 3, 4, 5, 6, 7, 8, 9, 10, 11, 12, 13, 14, 15, 16:
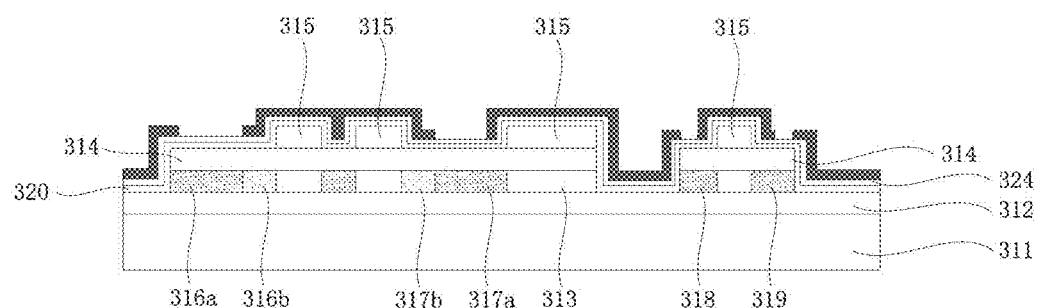
Figures 2, 3, 4, 5, 6, 7, 8, 9, 10, 11, 12, 13, 14, 15, 16, 17:
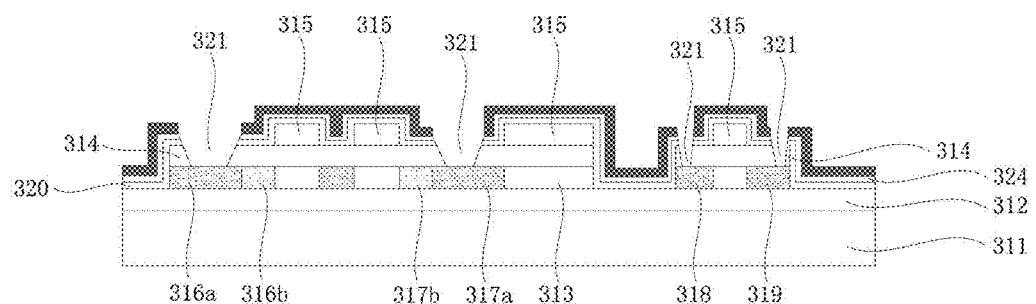
Figures 2, 3, 4, 5, 6, 7, 8, 9, 10, 11, 12, 13, 14, 15, 16, 17, 18:
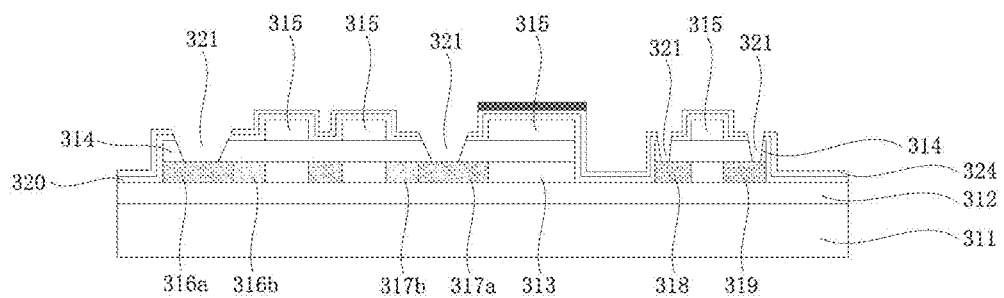
Figures 2, 3, 4, 5, 6, 7, 8, 9, 10, 11, 12, 13, 14, 15, 16, 17, 18, 19:
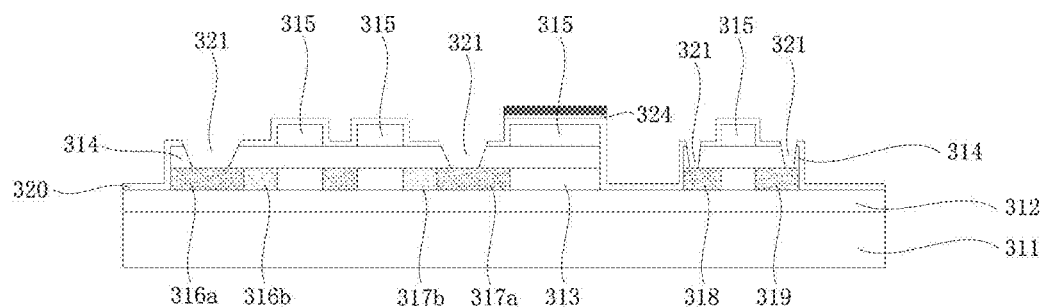
Figures 2, 3, 4, 5, 6, 7, 8, 9, 10, 11, 12, 13, 14, 15, 16, 17, 18, 19, 20:
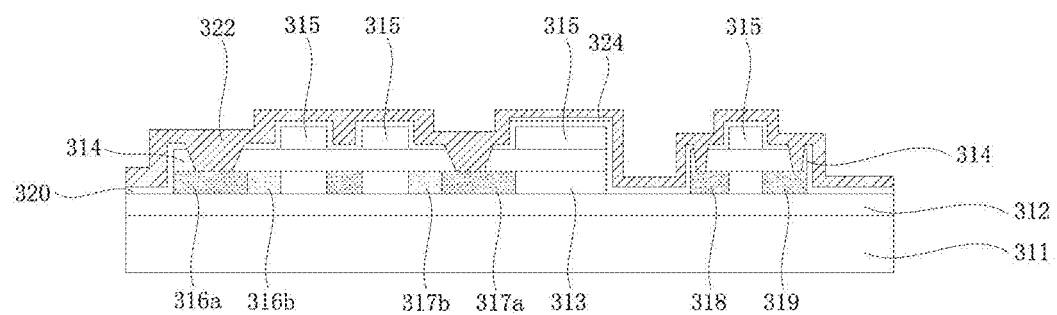
Figures 2, 3, 4, 5, 6, 7, 8, 9, 10, 11, 12, 13, 14, 15, 16, 17, 18, 19, 20, 21:
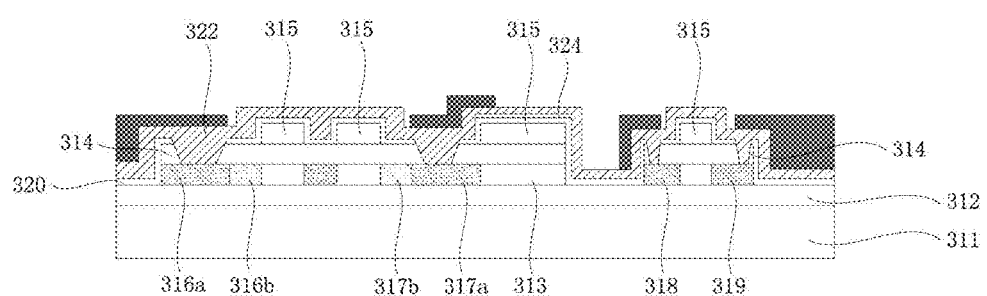
Figures 2, 3, 4, 5, 6, 7, 8, 9, 10, 11, 12, 13, 14, 15, 16, 17, 18, 19, 20, 21, 22:
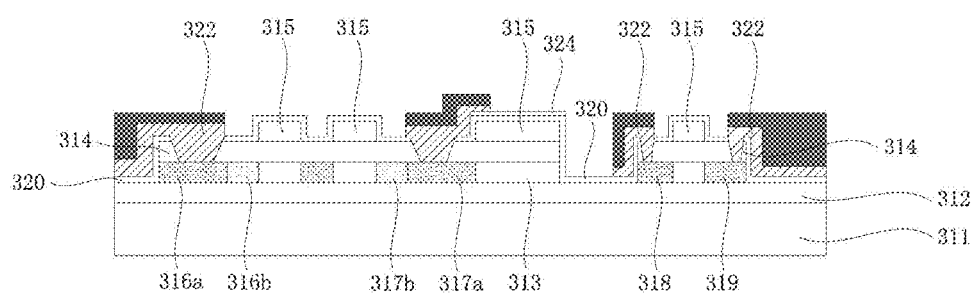
Figures 2, 3, 4, 5, 6, 7, 8, 9, 10, 11, 12, 13, 14, 15, 16, 17, 18, 19, 20, 21, 22, 23:
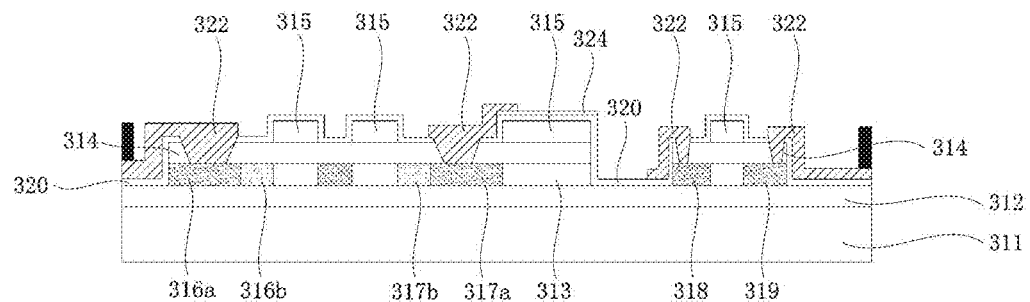
Figures 2, 3, 4, 5, 6, 7, 8, 9, 10, 11, 12, 13, 14, 15, 16, 17, 18, 19, 20, 21, 22, 23, 24:
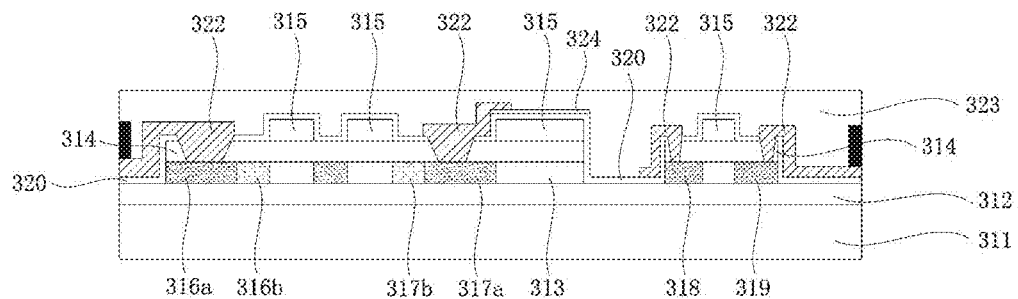
Figures 2, 3, 4, 5, 6, 7, 8, 9, 10, 11, 12, 13, 14, 15, 16, 17, 18, 19, 20, 21, 22, 23, 24, 25:
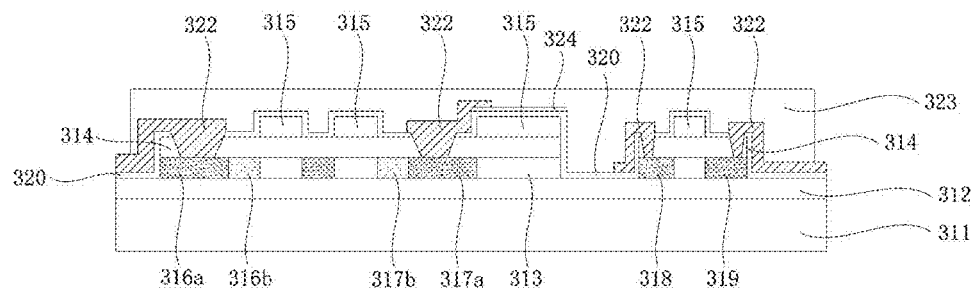

Next, as shown in FIG. 2-4, etch removing the first metal layer 315 above the heavily doped region 316*a* of the source electrode of the N-channel area and above the heavily doped region 317*a* of the drain electrode of the N-channel area; here, dry etch or wet etch method may be adopted.

Next, as shown in FIG. 2-5, performing ion implantation on the heavily doped region 316*a* of the source electrode of the N-channel area and the heavily doped region 317*a* of the drain electrode of the N-channel area; here, the P/As ion may be adopted for implantation.

Next, as shown in FIG. 2-6, performing ashing process on the remaining photoresist, so as to remove the remaining photoresist above the lightly doped region 316*b* of the source electrode and above the lightly doped region 317*b* of the drain electrode.

Next, as shown in FIG. 2-7, etch removing the first metal layer 315 above the lightly doped region 316*b* of the source electrode and above the lightly doped region 317*b* of the drain electrode; here, dry etch or wet etch method may be adopted.

Next, as shown in FIG. 2-8, performing ion implantation again on the heavily doped region 316*a* and the lightly doped region 316*b* of the source electrode of the N-channel area, as well as the heavily doped region 317*a* and the lightly doped region 317*b* of the drain electrode of the N-channel area; here, the P/As ion may be adopted for implantation.

Finally, removing all the remaining photoresist by using the ashing process.

In step 220, defining a doped region 318 of the source electrode of the P-channel area, and a doped region 319 of the drain electrode of the P-channel area by using a second photomask having a second pattern (for example, the gray tone mask (GTM) photomask or the half tone mask (HTM) mask).

Furthermore, step 220 particularly includes the following steps.

First, as show in FIG. 2-9, coating photoresist (indicated by a gray block in the drawing) on the substrate 311 after finishing step 210.

Next, as shown in FIG. 2-10, exposing and developing the photoresist by using the second photomask, so as to remove the photoresist between the N-channel area and the P-channel area, and to remove part of the photoresist above the doped region 318 of the source electrode of the P-channel area and above the doped region 319 of the drain electrode of the P-channel area.

Next, as shown in FIG. 2-11, removing the polycrystal silicon layer 313, the first insulating layer 314 and the first metal layer 315 between the N-channel area and the P-channel area; here, dry etch or wet etch method may be adopted.

Next, as shown in FIG. 2-12, performing ashing process on the remaining photoresist, so as to remove the remaining photoresist above the doped region 318 of the source electrode of the P-channel area and above the doped region 319 of the drain electrode of the P-channel area.

Next, as shown in FIG. 2-13, etch removing the first metal layer 315 above the doped region 318 of the source electrode of the P-channel area and above the doped region 319 of the drain electrode of the P-channel area; here, dry etch or wet etch method may be adopted.

Next, as shown in FIG. 2-14, performing ion implantation on the doped region 318 of the source electrode of the P-channel area and the doped region 319 of the drain electrode of the P-channel area, so as to form the source electrode and the drain electrode of the P-channel area; here, the P/As ion may be adopted for implantation.

Finally, removing all the remaining photoresist by using the ashing process.

In step 230, defining a pixel region, a contact hole region at the heavily doped region 317*a* of the drain electrode of the N-channel area, a contact hole region at the heavily doped region 316*a* of the source electrode of the N-channel area, a contact hole region at the doped region 318 of the source electrode of the P-channel area, and a contact hole region 319 at the doped region of the drain electrode of the P-channel area by using a third photomask having a third pattern (for example, the gray tone mask (GTM) photomask or the half tone mask (HTM) mask).

Furthermore, step 230 particularly includes the following steps.

First, as shown in FIG. 2-15, forming a second insulating layer 320, a transparent conductive layer 324 and a photoresist on the substrate 311 after finishing step 220, here, the second insulating layer 320 may be, for example, the SiO/SiN$_x$ laminated structure, the transparent conductive layer 324 may be, for example, the metal oxide thin film layer which is transparent and may have good conductivity, such as the indium tin oxide (ITO), the zinc based oxide (AZO, BZO, etc.), the indium gallium zinc oxide (IGZO) and so on.

Next, as shown in FIG. 2-16, exposing and developing the photoresist by using the third photomask, so as to remove the photoresist above the heavily doped region 317*a* of the drain electrode of the N-channel area and above the heavily doped region 316*a* of the source electrode of the N-channel area, and to remove the photoresist above the doped region 318 of the source electrode of the P-channel area and above the doped region 319 of the drain electrode of the P-channel area.

Next, as shown in FIG. 2-17, removing the first insulating layer 314, the transparent conductive layer 324 and the second insulating layer 320 above the heavily doped region 317*a* of the drain electrode of the N-channel area and above the heavily doped region 316*a* of the source electrode of the N-channel area, as well as above the doped region 318 of the source electrode of the P-channel area and above the doped region 319 of the drain electrode of the P-channel area, so that contact holes 321 may go through the transparent conductive layer 324, the second insulating layer 320 and the first insulating layer 314, so as to expose the heavily doped region 317*a* of the drain electrode of the N-channel area and the heavily doped region 316*a* of the source electrode of the N-channel area, as well as the doped region 318 of the source electrode of the P-channel area and the doped region 319 of the drain electrode of the P-channel area.

Next, as shown in FIG. 2-18, performing ashing process on the remaining photoresist, so as to remove all the other photoresist than the photoresist in the pixel region, thus exposing all the other transparent conductive layer 324 than the transparent conductive layer 324 in said pixel region.

Finally, as shown in FIG. 2-19, removing the exposed transparent conductive layer 324.

In step 240, defining a metal electrode region at the heavily doped region 317a of the drain electrode of the N-channel area, a metal electrode region at the heavily doped region 316a of the source electrode of the N-channel area, a metal electrode region at the doped region 318 of the source electrode of the P-channel area, and a metal electrode region 319 at the doped region of the drain electrode of the P-channel area by using a fourth photomask having a fourth pattern (for example, the gray tone mask (GTM) photomask or the half tone mask (HTM) mask).

Furthermore, step 240 particularly includes the following steps.

First, as shown in FIG. 2-20, forming a second metal layer 322 on the substrate 311 after finishing step 230, here, the second metal layer 322 may be, for example, the MoAlMo structure or the TiAlTi structure.

Next, as shown in FIG. 2-21, coating photoresist on the second metal layer 322; exposing and developing the photoresist by using the fourth photomask, so as to remove all the other photoresist than the photoresist above the heavily doped region 317a of the drain electrode of the N-channel area and above the heavily doped region 316a of the source electrode of the N-channel area, and the photoresist above the doped region 318 of the source electrode of the P-channel area and above the doped region 319 of the drain electrode of the P-channel area.

Next, as shown in FIG. 2-22, etch removing the exposed second metal layer 322; here, dry etch or wet etch method may be adopted.

Next, as shown in FIG. 2-23, removing the photoresist above the heavily doped region of the drain electrode 317a of the N-channel area and the photoresist above doped region 318 of the source electrode of the P-channel area; removing part of the photoresist above the heavily doped region 316a of the source electrode of the N-channel area and removing part of the photoresist above the doped region 319 of the drain electrode of the P-channel area.

Next, as shown in FIG. 2-24, forming a passivation layer 323 through deposition, here, the material adopted by the passivation layer 323 may be, for example, SiNx.

Finally, removing part of the photoresist and the passivation layer 323 above the heavily doped region 316a of the source electrode of the N-channel area, and removing part of the photoresist and the passivation layer 323 above the doped region 319 of the drain electrode of the P-channel area, so as to expose the second metal layer 322 above the heavily doped region 317a of the drain electrode of the N-channel area and the second metal layer 322 above the doped region 318 of the source electrode of the P-channel area, so as to connect the external driving circuit.

Based on above, the manufacturing method according to the embodiments of the present invention only adopts four photomasks to achieve the manufacturing of the lower temperature polycrystal silicon thin film transistor array substrate, which may significantly reduce the number of photomasks to be used, thereby reducing the production cost while improving the production efficiency.

Although the present invention is described with reference to the special exemplary embodiment, while those skilled in the art will understand: various changes in form and details may be made therein without departing from the spirit and scope of the invention as defined by the appended claims and its equivalents.

What is claimed is:

1. A method of manufacturing lower temperature polycrystal silicon thin film transistor array substrate, comprising:
    A) defining a heavily doped region of a source electrode of an N-channel area, a lightly doped region of the source electrode of the N-channel area, a heavily doped region of a drain electrode of the N-channel area and a lightly doped region of the drain electrode of the N-channel area by using a first photomask having a first pattern;
    B) defining a doped region of a source electrode of a P-channel area and a doped region of a drain electrode of the P-channel area by using a second photomask having a second pattern;
    C) defining a pixel region, a contact hole region at the heavily doped region of the drain electrode of the N-channel area, a contact hole region at the heavily doped region of the source electrode of the N-channel area, a contact hole region at the heavily doped region of the drain electrode of the P-channel area, and a contact hole region at the heavily doped region of the source electrode of the P-channel area by using a third photomask having a third pattern; and
    D) defining a metal electrode region at the heavily doped region of the drain electrode of the N-channel area, a metal electrode region at the heavily doped region of the source electrode of the N-channel area, a metal electrode region at the heavily doped region of the drain electrode of the P-channel area, and a metal electrode region at the heavily doped region of the source electrode of the P-channel area by using a fourth photomask having a fourth pattern;
    wherein step B) further comprises:
    coating a photoresist on a substrate after performing said step A);
    exposing and developing the photoresist by using the second photomask, so as to remove the photoresist between the N-channel area and the P-channel area, and to remove part of the photoresist above the doped region of the source electrode of the P-channel area and above the doped region of the drain electrode of the P-channel area;
    removing a polycrystal silicon layer, a first insulating layer and a first metal layer between the N-channel area and the P-channel area;
    removing remaining photoresist above the doped region of the source electrode of the P-channel area and above the doped region of the drain electrode of the P-channel area;
    etching and removing the first metal layer above the doped region of the source electrode of the P-channel area and above the doped region of the drain electrode of the P-channel area;
    performing ion implantation on the doped region of the source electrode of the P-channel area and the doped region of the drain electrode of the P-channel area; and
    removing all remaining photoresist.

2. The method of claim 1, wherein the first photomask is a greyscale photomask or a halftone photomask.

3. The method of claim 1, wherein the second photomask is a greyscale photomask or a halftone photomask.

4. The method of claim 1, wherein the third photomask is a greyscale photomask or a halftone photomask.

5. The method of claim 1, wherein the fourth photomask is a greyscale photomask or a halftone photomask.

6. The method of claim 1, wherein step A) further comprises:
forming in sequence a buffer layer, the polycrystal silicon layer, the first insulating layer and the first metal layer on the substrate;
coating a layer of the photoresist on the first metal layer;
exposing and developing the photoresist by using the first photomask, so as to remove the photoresist above the heavily doped region of the source electrode of the N-channel area and above the heavily doped region of the drain electrode of the N-channel area, and to remove part of the photoresist above the lightly doped region of the source electrode and above the lightly doped region of the drain electrode;
etching and removing the first metal layer above the heavily doped region of the source electrode of the N-channel area and above the heavily doped region of the drain electrode of the N-channel area;
performing a first ion implantation on the heavily doped region of the source electrode of the N-channel area and the heavily doped region of the drain electrode of the N-channel area;
removing remaining photoresist above the lightly doped region of the source electrode of the N-channel area and above the lightly doped region of the drain electrode of the N-channel area;
etching and removing the first metal layer above the lightly doped region of the source electrode and the lightly doped region of the drain electrode;
performing a second ion implantation again on the heavily doped region and lightly doped region of the source electrode of the N-channel area as well as the heavily doped region and lightly doped region of the drain electrode of the N-channel area; and
removing all remaining photoresist.

7. The method of claim 2, wherein step A) further comprises:
forming in sequence a buffer layer, the polycrystal silicon layer, the first insulating layer and the first metal layer on the substrate;
coating a layer of the photoresist on the first metal layer;
exposing and developing the photoresist by using the first photomask, so as to remove the photoresist above the heavily doped region of the source electrode of the N-channel area and above the heavily doped region of the drain electrode of the N-channel area, and to remove part of the photoresist above the lightly doped region of the source electrode and above the lightly doped region of the drain electrode;
etching and removing the first metal layer above the heavily doped region of the source electrode of the N-channel area and above the heavily doped region of the drain electrode of the N-channel area;
performing a first ion implantation on the heavily doped region of the source electrode of the N-channel area and the heavily doped region of the drain electrode of the N-channel area;
removing remaining photoresist above the lightly doped region of the source electrode of the N-channel area and above the lightly doped region of the drain electrode of the N-channel area;
etching and removing the first metal layer above the lightly doped region of the source electrode and the lightly doped region of the drain electrode;
performing a second ion implantation again on the heavily doped region and lightly doped region of the source electrode of the N-channel area as well as the heavily doped region and lightly doped region of the drain electrode of the N-channel area; and
removing all remaining photoresist.

8. The method of claim 1, wherein the step C) comprises:
forming a second insulating layer, a transparent conductive layer and the photoresist on the substrate after finishing step B);
exposing and developing the photoresist by using the third photomask, so as to remove the photoresist above the heavily doped region of the drain electrode of the N-channel area and above the heavily doped region of the source electrode of the N-channel area, and to remove the photoresist above the doped region of the source electrode of the P-channel area and above the doped region of the drain electrode of the P-channel area;
removing the first insulating layer, the transparent conductive layer and the second insulating layer above the heavily doped region of the drain electrode of the N-channel area and above the heavily doped region of the source electrode of the N-channel area, as well as above the doped region of the source electrode of the P-channel area and above the doped region of the drain electrode of the P-channel area, so as to form a contact hole;
removing all photoresist except the photoresist in the pixel region, so as to expose all the other transparent conductive layer than the transparent conductive layer in said pixel region; and
removing the exposed transparent conductive layer.

9. The method of claim 4, wherein the step C) comprises:
forming a second insulating layer, a transparent conductive layer and the photoresist on the substrate after finishing step B);
exposing and developing the photoresist by using the third photomask, so as to remove the photoresist above the heavily doped region of the drain electrode of the N-channel area and above the heavily doped region of the source electrode of the N-channel area, and to remove the photoresist above the doped region of the source electrode of the P-channel area and above the doped region of the drain electrode of the P-channel area;
removing the first insulating layer, the transparent conductive layer and the second insulating layer above the heavily doped region of the drain electrode of the N-channel area and above the heavily doped region of the source electrode of the N-channel area, as well as above the doped region of the source electrode of the P-channel area and above the doped region of the drain electrode of the P-channel area, so as to form a contact hole;
removing all photoresist except the photoresist in the pixel region, so as to expose all the other transparent conductive layer than the transparent conductive layer in said pixel region; and
removing the exposed transparent conductive layer.

10. The method of claim 1, wherein the step D) comprises:
forming a second metal layer on the substrate after finishing step C);

coating the photoresist on the second metal layer; exposing and developing the photoresist by using the fourth photomask, so as to remove all photoresist except the photoresist above the heavily doped region of the drain electrode of the N-channel area and above the heavily doped region of the source electrode of the N-channel area, and the photoresist above the doped region of the source electrode of the P-channel area and above the doped region of the drain electrode of the P-channel area;

etching and removing the exposed second metal layer;

removing the photoresist above the heavily doped region of the drain electrode of the N-channel area and the photoresist above doped region of the source electrode of the P-channel area; removing part of the photoresist above the heavily doped region of the source electrode of the N-channel area and removing part of the photoresist above the doped region of the drain electrode of the P-channel area;

forming a passivation layer through deposition; and removing part of the photoresist above the heavily doped region of the source electrode of the N-channel area and removing part of the photoresist and the passivation layer above the doped region of the drain electrode of the P-channel area.

11. The method of claim 5, wherein the step D) comprises:

forming a second metal layer on the substrate after finishing step C);

coating the photoresist on the second metal layer; exposing and developing the photoresist by using the fourth photomask, so as to remove all photoresist except the photoresist above the heavily doped region of the drain electrode of the N-channel area and above the heavily doped region of the source electrode of the N-channel area, and the photoresist above the doped region of the source electrode of the P-channel area and above the doped region of the drain electrode of the P-channel area;

etching and removing the exposed second metal layer;

removing the photoresist above the heavily doped region of the drain electrode of the N-channel area and the photoresist above doped region of the source electrode of the P-channel area; removing part of the photoresist above the heavily doped region of the source electrode of the N-channel area and removing part of the photoresist above the doped region of the drain electrode of the P-channel area;

forming a passivation layer through deposition; and removing part of the photoresist above the heavily doped region of the source electrode of the N-channel area and removing part of the photoresist and the passivation layer above the doped region of the drain electrode of the P-channel area.

\* \* \* \* \*